(12) United States Patent
Allibert et al.

(10) Patent No.: US 8,153,504 B2
(45) Date of Patent: Apr. 10, 2012

(54) PROCESS FOR MANUFACTURING A COMPOSITE SUBSTRATE

(75) Inventors: Frederic Allibert, Grenoble (FR); Sebastien Kerdiles, Saint-Ismier (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 12/742,424

(22) PCT Filed: Mar. 26, 2008

(86) PCT No.: PCT/EP2008/053563
§ 371 (c)(1),
(2), (4) Date: May 11, 2010

(87) PCT Pub. No.: WO2008/116879
PCT Pub. Date: Oct. 2, 2008

(65) Prior Publication Data
US 2010/0323496 A1    Dec. 23, 2010

(30) Foreign Application Priority Data
Mar. 28, 2007   (FR) ..................... 07 54077

(51) Int. Cl.
*H01L 21/30* (2006.01)
*H01L 21/46* (2006.01)
(52) U.S. Cl. ....................... 438/455; 438/458
(58) Field of Classification Search .......... None
See application file for complete search history.

(56) References Cited

U.S. PATENT DOCUMENTS

| | | | |
|---|---|---|---|
| 7,435,614 B2 | 10/2008 | Bruel | |
| 7,605,054 B2 * | 10/2009 | Celler | ............ 438/456 |

FOREIGN PATENT DOCUMENTS

| | | |
|---|---|---|
| FR | 2 873 235 A1 | 1/2006 |
| FR | 2 876 220 A1 | 4/2006 |
| WO | 02084721 A2 | 10/2002 |
| WO | 02084722 A2 | 10/2002 |
| WO | 2004/057663 A1 | 7/2004 |

OTHER PUBLICATIONS

International Search Report of the ISA/EP, International Application No. PCT/EP2008/053563, mailed Jun. 5, 2008, three (3) pages.
Written Opinion of the ISA/EP, International Application No. PCT/EP2008/053563, mailed Jun. 5, 2008, seven (7) pages.
Plobl et al., Wafer Direct Bonding: Tailoring Adhesion Between Brittle Materials, Materials Science and Engineering, R25 (1999) pp. 1-88.
Vitale et al., Reduction of Silicon Recess Caused by Plasma Oxidation During High-Density Plasma Polysilicon Gate Etching, J. Vac. Sci. Technol. B 21(5) Sep./Oct. 2003.

* cited by examiner

*Primary Examiner* — Scott B Geyer
(74) *Attorney, Agent, or Firm* — TraskBritt

(57) ABSTRACT

The invention relates to a process for manufacturing a composite substrate comprising bonding a first substrate onto a second semiconducting substrate, characterized in that the process includes, before bonding, the formation of a bonding layer between the first and the second substrate, the bonding layer comprising a plurality of islands distributed over a surface of the first substrate in a determined pattern and separated from one another by regions of a different type, which are distributed in a complementary pattern, wherein the islands are formed via a plasma treatment of the material of the first substrate.

12 Claims, 4 Drawing Sheets

PROCESS FOR MANUFACTURING A COMPOSITE SUBSTRATE

CROSS-REFERENCE TO RELATED APPLICATION

This is a national phase entry under 35 U.S.C. §371 of International Patent Application PCT/EP2008/053563, filed Mar. 26, 2008, published in English as International Patent Publication WO 2008/116879 A1 on Oct. 2, 2008, which claims the benefit under 35 U.S.C. §119 of French Patent Application Serial No. 0754077, filed Mar. 28, 2007, the contents of each of which are hereby incorporated herein by this reference.

FIELD OF THE INVENTION

This invention relates to a process for manufacturing a composite substrate by bonding of two substrates, wherein, before bonding, a bonding layer of which the structure is scalable, based on the desired bonding energy to be obtained within the composite substrate, is formed.

BACKGROUND OF THE INVENTION

In many microelectronic, optoelectronic and electronic applications, it is advantageous to control the bonding energy in a composite substrate made of two bonded substrates.

The control of the bonding energy especially arises when the composite substrate is intended to be debonded. The debonding of the composite substrate is understood in this text as the separating of the bonded substrates without damaging them.

For example, it is interesting to be able to detach a semi-conducting layer from a substrate in order to ultimately transfer it onto another support, the layer containing or not containing all or part of an electronic component.

To that end, the bonding energy shall be low enough to allow debonding of the composite substrate without damaging one or both of the substrates.

On the other hand, it is often required to have a bonding energy sufficiently high in order to avoid a separation of the bonded substrates before the desired moment of debonding.

One particularly advantageous application consists in using a semiconductor-on-insulator (SeOI) type of substrate capable of being removed from the insulator. An SeOI substrate such as this successively includes a so-called intermediate substrate, an insulating layer and a semiconducting layer. Removal from the insulator enables the semiconducting layer to be released and the intermediate substrate to be reused.

Various methods have been developed for transferring the semiconducting layer onto a final support, and for ultimately recovering the intermediate substrate.

The document WO 02/084722 describes the creation of an interface by bonding together a face of one wafer with a face of another wafer, comprising a step for pre-treating at least one of the two faces in order to control the degree of mechanical strength of the interface.

This treatment consists in controlling the roughness and/or hydrophilicity of at least one of the faces, the effect of which is to reduce the bonding energy of the debondable interface, and to thereby make it possible to facilitate the removal.

As a matter of fact, at a microscopic scale, roughening, as practiced in the prior art, creates surface cavities. Consequently, the actual contact surface area is smaller than the area of the bonding interface, which makes it possible to reduce the bonding energy. However, the roughening technique has a disadvantage in that the distribution of the cavities on the treated face is random and uneven. Furthermore, the shapes and dimensions (depth and area) of these cavities are not constant.

The result of this is that the process does not enable a predefined and reproducible bonding energy to be obtained.

Furthermore, this treatment is applied to the entire surface of the substrate and does not enable particular areas of the interface to be treated differently.

Another technique elaborated upon in the document WO 02/084721 proposes the creation of an interface with areas of different mechanical strength. This document provides for at least one first area having a reliable degree of mechanical strength to be surrounded by at least one second peripheral area having a higher degree of mechanical strength, in order prevent risks of delamination; in particular, an interface such as this can be in the form of parcels of reliable mechanical strength surrounded by areas of higher mechanical strength, each parcel corresponding to a component.

It is understood, therefore, that this process enables the creation of interfaces having bonding energies that are differentiated according to the parcels, but the parcels thus defined continue to be of considerable dimensions (from 1 micrometer to a few millimeters), with the result being that there is a risk of tearing during the removal operation.

The treatments described above are therefore imprecise because they do not enable the surface condition of the bonding interface, and consequently the bonding energy thereof, to be controlled at a sufficiently small scale.

Furthermore, they require perfectly uniform and planar interfaces for optimal bonding.

Another method for providing a debondable substrate wherein the bonding energy is controlled is disclosed in FR 2 783 235. This method consists in forming cavities on the surface of one of the substrates, so that the substrates are bonded only in the regions between the cavities. The bonding energy is controlled via the control of the total surface of the cavities. However, this method does not allow obtaining high bonding energy in the regions between the cavities, because the materials in contact are materials such as silicon, which have a relatively low bonding energy. This method thus provides a composite substrate with a limited bonding energy, which can be too low in some cases.

DISCLOSURE OF THE INVENTION

The purpose of this invention is to remedy these disadvantages and to propose a composite substrate, the bonding energy of which is scalable and reproducible, thereby ensuring, for example, on the one hand, bonding with a high degree of bonding energy and, on the other hand, a debonding operation capable of being carried out without any risk of tearing.

The invention aims at offering a process making it possible to obtain a composite substrate, the bonding energy of which, at the bonding interface, has a value that can be selectively adjusted (in terms of value and of distribution on the interface), based on the subsequent use of the substrate.

A process such as this makes it possible to obtain a range of more or less easily debondable substrates, i.e., capable of being debonded via the addition of a relatively low or high degree of energy.

The bonding energy of the composite substrate is defined in this text as the energy required to separate the two substrates. If the bonding layer between the two substrates is made of different materials, the bonding energy is not uniform on the interface. The bonding energy of the composite substrate is high in the regions of the interface where materials having a high bonding strength are in contact, and is low in the regions of the interface where materials in contact have a lower bonding strength. It is thus possible to determine a mean bonding energy of the composite substrate based on the relative surfaces of the regions with a high bonding energy and of the regions with a low bonding energy.

According to the invention, a process is proposed for manufacturing a composite substrate by bonding a first substrate onto a second semiconducting substrate, the process comprising the formation of a bonding layer between the substrates, the bonding layer comprising islands distributed over a surface of the first substrate in a determined pattern and separated from one another by regions of a different type, which are distributed in a complementary pattern. The islands are formed via a plasma treatment of the material of the first substrate.

Furthermore, according to other advantageous but non-limiting characteristics of the invention:
- the regions of a different type are made of a different material from that of the islands;
- the regions of a different type are empty;
- the process includes the steps of:
  i) formation of a mask on the surface of the first substrate in the complementary pattern, whereby the mask does not cover the areas corresponding to the pattern, and
  ii) formation of the islands in the areas of the first substrate not covered by the mask;
- the plasma is of the $O_2$, $N_2$ type, or a mixture thereof;
- a step iii) for removing the mask is carried out during or after step ii);
- prior to bonding, and embrittlement area is produced in the second substrate, so as to define a thin layer;
- after bonding, the remainder of the second substrate is detached along the embrittlement area;
- the bonding operation is a molecular adhesion bonding operation;
- after bonding, a heat treatment is performed, which is intended to intensify the bonding energy;
- the bonding step is followed by a step for removing the second substrate from the first substrate;
- the removal operation is carried out via chemical etching; and
- before the debonding operation, the thin layer is bonded to a final support.

BRIEF DESCRIPTION OF THE DRAWINGS

Other characteristics and advantages of the invention will become more apparent upon reading the following description thereof, which will be made with reference to the appended drawings, in which.

DETAILED DESCRIPTION OF THE INVENTION

The following description applies more particularly to composite substrates of the silicon-on-insulator (SOI) type, but can be applied to other materials, such as GeOI (Germanium-on-Insulator), GaNOI (GaN-on-Insulator), GaNOS (GaN-on-Sapphire), SopSiC (Silicon-on-poly-SiC), SapOS (Sapphire-on-Sapphire) substrates, or else substrates comprising ferroelectric or piezoelectric-on-insulator layers, and also substrates on which components have already been produced, either partially or entirely (e.g., three-dimensional integration, flipping over of the processed layer).

Figure 1:
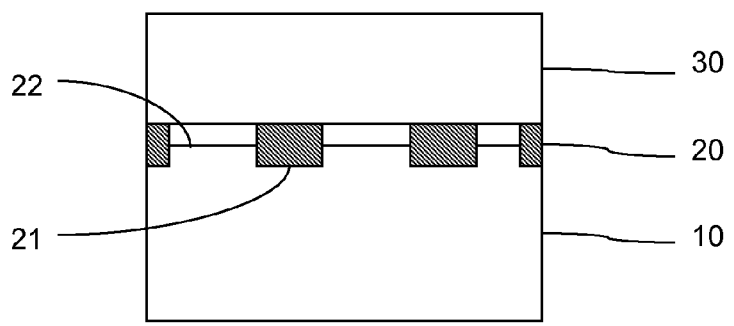
FIG. 1 shows a composite substrate in accordance with the invention.

With reference to FIG. 1, a composite substrate according to the invention successively includes at least one first substrate 10, a bonding layer 20 and a second substrate 30.

The first substrate 10 serves as a mechanical support.

In this regard, if the composite substrate is intended to be debonded, the first substrate 10 can likewise be qualified as an intermediate substrate, because this substrate enables the manufacture of a final semiconducting layer from substrate 30, which will then be transferred onto a final substrate, this substrate 10 being optionally reusable after debonding. This first substrate 10 is made of a semiconducting or non-conducting material, e.g., silicon. It may consist of a single layer or several layers of different materials.

The second substrate 30 can be qualified as a source substrate because, in a SMARTCUT™ type process, it includes an embrittlement zone enabling a thin layer 31 to be transferred to the first substrate 10 or an intermediate substrate. This second substrate 30, or source substrate, is made of a semiconducting material such as silicon, for example. It may consist of a single layer or possibly several layers of different materials, such as a layer of silicon covered with an $SiO_2$ or $Si_3N_4$ layer, based on the subsequent desired uses to be made thereof.

The bonding layer 20 is formed from a plurality of islands 21, separated from one another by regions 22 of a different type.

In a particularly advantageous manner, the islands 21 are made of an insulating material such as $SiO_2$ or $Si_3N_4$.

According to a first embodiment, the regions 22 of a different type are made of a different material from that of the islands 21.

If the islands 21 have a very small thickness in comparison to a surface of substrate 10, the bonding layer 20 will comprise oxide islands 21, for example, separated by (considering that the substrate 10 is in silicon) silicon regions 22.

In this case, the thickness of the islands 21 is sufficiently small so that bonding occurs between the substrates 10 and 30, in the regions 22 between the islands 21, with a low degree of bonding energy, as concerns the silicon.

By contrast, bonding energy between the oxide islands 21 and the substrate 30 is higher.

It can be thus understood that the control of the total surface of the islands 21 and the total surface of the regions 22 between the islands 21, allow modulating the bonding energy of the composite substrate.

According to another embodiment, the regions 22 of a different type are empty, whereby upper faces of islands 21 are raised relative to the surface of the first substrate 10. Throughout the remainder of this text, these empty regions 22 surrounding the islands may likewise be designated by the term "channels." As will be seen, the presence of these channels facilitates debonding of the second substrate 30 and the first substrate 10.

The thickness at which the islands 21 are considered to be surrounded by a void depends on the materials used and the subsequent heat treatments. As a matter of fact, mechanical forces exist that tend to close the channels between islands if the height of these islands is too small. In particular, when heat treatments are applied to a structure comprising islands, the material of the islands becomes reshaped, while having a tendency to fill in the void existing between the islands.

Figure 4:
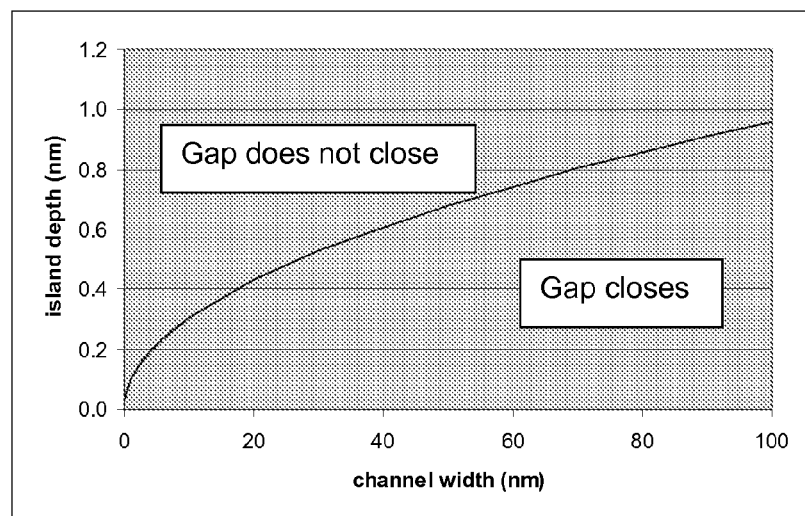
FIG. 4 is a graph simulating a thickness limit of the islands by reason of which channels become closed up.

In this regard, reference can be made to the model presented by Plöβl et al. (*Materials Science and Engineering* R25, 1999, pp. 1-88, model p. 8). FIG. 4, which takes up this model, shows a height limit at which the channels close up, and it is observed that, for an island thickness greater than 1 nm, channels are obtained that do not close up.

Consequently, for a distance between islands 21 ranging up to one hundred nanometers, if the islands are made of $SiO_2$, and if light heat treatments are applied, then it can be considered that an island 21 thickness of the order of one nanometer is sufficient. On the other hand, in the case of a heavy heat treatment, in order to obtain void regions 22 between the islands 21, and to thereby form channels between the islands, it is necessary to form islands 21 of several nanometers in thickness, and, more precisely, of the order of 50 Å to 100 Å in thickness. It is likewise possible to stay limited to narrower channels, i.e., the width of which is of the order of a few tenths of a nanometer.

According to one preferred embodiment, the thickness of the islands 21 is constant and between 5 Å and 1000 Å, and preferably between 10 Å and 100 Å.

The islands 21 are distributed over the surface of the first substrate in a specific pattern, the regions 22 of a different type being distributed in a complementary pattern. The patterns can be optimized according to the desired bonding energy of the composite substrate and/or the debonding technique chosen.

Figure 2:
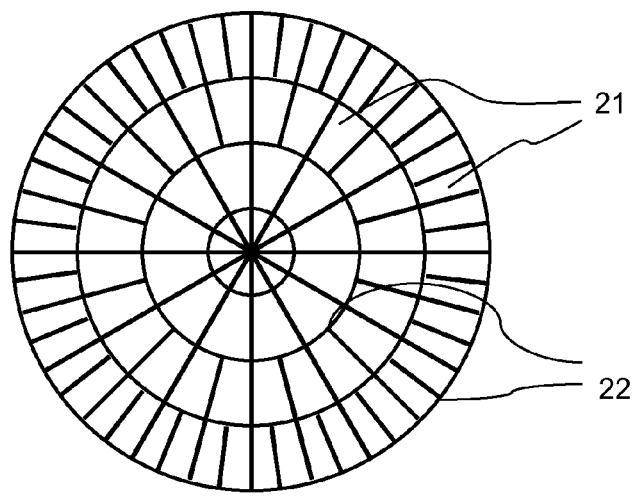
FIG. 2 shows a first alternative distribution of islands over a surface of a substrate.

For example, for debonding via chemical means (liquid or gaseous), preference may be given to channels having a radial arrangement, as well as other arrangements in the form of concentric circles, which will facilitate the propagation of the etching solution into bonding layer 20, as is shown, for example, in FIG. 2. It may then be possible to create channels 22 having a width of the order of a few tens of nanometers up to a few hundred nanometers, separating islands 21 capable of measuring a few hundred nanometers to a few microns in width. In this context, it is more important to control the size of the channels 22 than that of the islands 21, since it is the channels 22 that enable the etching solution to propagate to the centre of the bonding layer 20.

Figure 3:
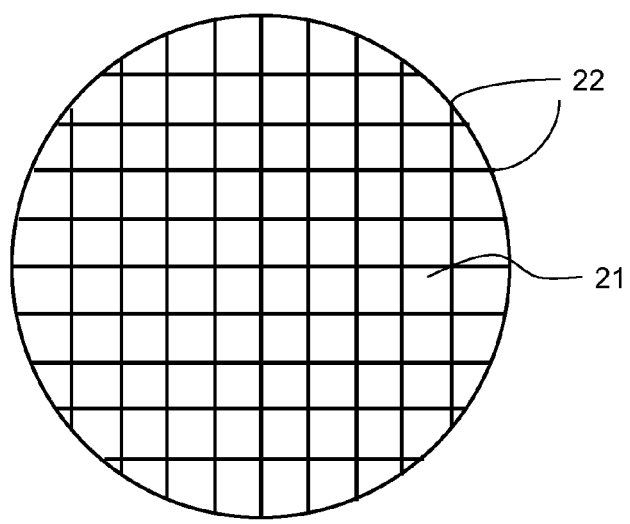
FIG. 3 shows a second alternative distribution of islands over a surface of a substrate.

If preference is given to mechanical debonding, then the most uniform distribution of the islands 21 as is possible will be preferred, as shown, for example, in FIG. 3, with islands 21 of substantially identical shape and of small dimensions, in order to not cause surges in the fracture wave propagation and to prevent possible tearing. Islands 21 will then be formed measuring a few nanometers to a few tens of nanometers, or even a few hundred nanometers, separated by channels 22 having substantially the same dimensions. The bonding energy will be controlled by the ratio between the surface of the islands 21 and that of the channels 22.

It is also possible to perforin a chemically assisted mechanical debonding, which enables an easier debonding with respect to the wafer edges in particular.

The length and width of the islands 21 can thus vary by approximately one nanometer to a few micrometers, preferably by one nanometer to one micrometer, or even by one nanometer to a few tens of nanometers. The islands 21 are thus sufficiently small for there to be no risk of tearing during the removal operation.

A surface layout has thus been defined, i.e., a set of islands 21 distributed in a desired pattern, having a constant difference in level between the upper face of the first substrate and the upper face of the islands. The layout therefore takes into account not only the thickness of the islands but also the surface thereof, as well as the distribution thereof over the surface of the first substrate.

The bonding layer thus has the advantage of enabling the production of a good quality bond during assembly with the second substrate 30. Since the islands are all at the same level, the bonding layer has a uniform thickness, even if it is discontinuous, thereby making it possible to ensure proper bonding energy.

The bonding layer has the further advantage of being easier to detach than a layer that might consist of the same material as that of the islands but that might be continuous.

As a matter of fact, the bonding surface corresponds to the total surface of the islands, and is therefore smaller than the total surface of the interface between the two substrates.

The degree of debonding force to be applied in order to separate the second substrate 30 from the first substrate 10 is therefore smaller.

Chemical etching turns out to be particularly well suited for the debonding operation.

As a matter of fact, the channels that are formed by the void regions 22 enable diffusion of the etching solution (or gas) as far as the centre of the interface formed by the assembly of the two substrates 10 and 30, which promotes uniform debonding over the entire surface.

In the case where it is desired to etch through a resin mask, hydrofluoric acid (HF) or ammonium fluoride will preferably be used. In liquid form, hydrofluoric acid will preferably be used in concentrations capable of ranging from 5% to 50%. In gas form, HF will be used at a temperature sufficient for it to be gaseous (i.e., at a temperature greater than 106° C. for HF diluted to 49% in water).

In the case where the materials to be etched are other than $SiO_2$, suitable etching solutions known to those skilled in the art will be used.

Even if the islands 21 have too small a thickness for channels to exist therebetween, and though the bonding layer 20 may appear planar at a microscopic scale, the slightly raised surface of the islands 21 means that, in the regions 22 between the islands 21, the distance between the molecules of the first substrate 10 and those of the second substrate 30 is larger, thereby producing a weaker chemical bond and a weaker bonding energy. On the contrary, there is a good degree of bonding energy between the islands 21 and the second substrate 30.

It is understood, therefore, that by choosing a suitable layout for the bonding layer, it is possible to modulate the force required to debond the composite substrate. In actual practice, the smaller the sum of the surfaces of the islands, the easier it will be to debond the substrate.

Furthermore, by varying the size of the patterns, it is possible to obtain various distributions of the bonding areas for the same total surface area of the islands. Thus, it is possible to have large bonding areas separated from large void areas (which will more easily lead to the creation of blisters or tears) or preferably smaller but more numerous spaces, so as to better distribute the bonding energy uniformily.

A process will now be described for manufacturing a composite substrate in accordance with the invention as described above.

The following description proposes a SMARTCUT™ type process for transferring a semiconducting layer from a source substrate to an intermediate substrate coated with the bonding layer thereof, but other techniques known to those skilled in the art, such as those involving BSOI (Bonded SOI) or else BESOI (Bonded and Etched-Back SOI) may be anticipated, depending on the type of bonding layer and the mechanical burn-in resistance thereof. Besides being based on molecular adhesion bonding, these techniques are based on physical removal of the source substrate via polishing-type techniques and/or chemical etching techniques, which result in the destruction of the source substrate.

Figure 5A:
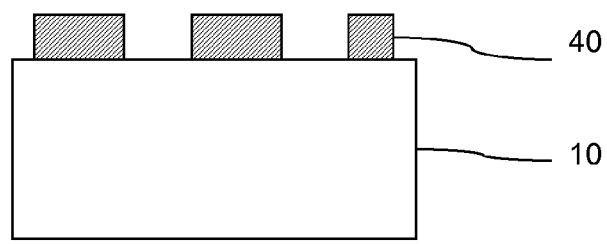
FIGS. 5A to 5C show steps for forming a bonding layer.

With reference to FIG. 5A, a first step consists in forming a mask 40 that will define the desired pattern on the surface of the first substrate 10.

The mask 40 is formed so as to not cover the areas of the surface of the first substrate 10 on which one wishes to form the islands. A first embodiment of the mask 40 uses the photolithography technique well known to those skilled in the art: a light-sensitive resin is deposited over the entire surface of the first substrate 10 and is then exposed to light radiation through a mask placed over the substrate or over the light source; finally, the resin is dissolved in the areas not exposed to the light.

According to another embodiment, a mask is deposited over the entire surface of the substrate and then certain areas are selectively etched by lithography.

Another way to create a mask 40 with patterns consists in using a resin wherein the patterns are printed using a press system, which involves nanoindentation.

The patterns may be optimized according to the required bonding energy and/or, if the composite substrate is intended to be debonded, to the debonding technique chosen.

For example, as described above with reference to FIG. 2, for removal via chemical means (liquid or gas), preference may be given to channels having a radial arrangement, as well as other arrangements in the form of concentric circles, which that will facilitate propagation of the etching solution into the bonding layer 20. If, as described above with reference to FIG. 3, mechanical removal is preferred, then the most uniform distribution of the islands as is possible will be preferred.

The lower size limit for the islands is determined using lithography or nanoindentation techniques. The upper size limit is determined with concern for preventing the formation of defects such as blisters or tears during the debonding operation. The length and width of the islands will preferably be between 1 nanometer and 1 micrometer.

Figure 5B:
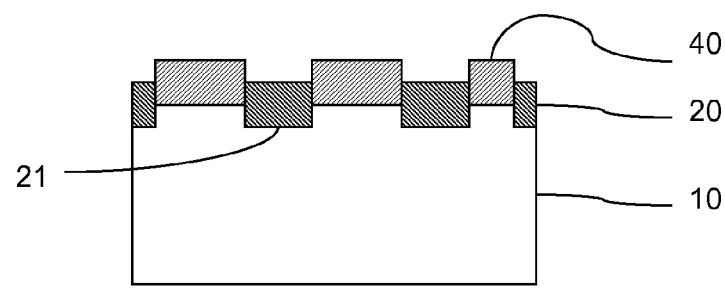

With reference to FIG. 5B, a second step consists in transforming or filling in the mask-free or cavity-free areas.

According to a preferred embodiment, a plasma treatment is applied.

While lightly etching the surface of the cavities, the plasma enables the growth of a very fine layer inside the cavities.

For example, during an oxygen plasma treatment applied to a silicon substrate 10, a fine layer of $SiO_2$ is formed, the oxide being more voluminous than the starting Si. The order of magnitude of this swelling amounts to a few angstroms.

The type of plasma depends on the type of bonding layer that one wishes to form inside the cavities.

Thus, in the case where the substrate 10 is made of silicon, an oxygen plasma treatment is used, preferably in order to form islands of $SiO_2$, whereas nitrogen plasma is preferred for obtaining islands of $Si_3N_4$.

Those skilled in the art will choose the plasma suited to the material of the substrate 10 and to the desired material for the islands 21.

It is also possible to combine various types of plasma.

It is thus possible to obtain a dual activation: $N_2$ plasma on substrate 30 and $O_2$ plasma on substrate 10, whereby the layer of $Si_3N_4$ formed on substrate 30 also serves as an etching barrier, which can be useful for subsequent technical steps.

The thickness of the islands is determined by the plasma conditions.

In this regard, reference can be made to the article by Vitale et al., "Reduction of silicon recess caused by plasma oxidation during high-density plasma polysilicon gate etching," *J. Vac. Sci. Technol.* B 21(5), Sep./Oct. 2003.

It is thus possible to obtain an oxide having a thickness ranging from approximately 25 Å to approximately 100 Å.

As is shown in the article by Vitale et al, during an $O_2$ plasma treatment of an Si wafer, and after the initial creation of the oxide, there is competition between the etching of the oxide by the plasma and the oxidation of the underlying Si.

This results in the islands 21 being pushed down into the substrate 10.

The height of the steps corresponding to the difference in level between the top of the islands and the surface of the regions of the substrate 10 situated between the islands decreases.

It can be controlled precisely by the plasma time.

It is thus possible to obtain steps of the order of 5 Å.

It is preferable to attempt to form steps the height of which is between ten angstroms and one hundred angstroms.

The plasma treatment therefore presents the advantage of being able to control very precisely the thickness of the islands formed, of the order of a few angstroms.

The ranges of "standard" conditions of use of the plasma for forming islands 21 at the surface of substrate 10 according to the invention are:

RF power: 0 to 4000 Watts
Pressure: 10 to 200 mTorr
Flow rate: 50 to 2000 sccm
Gas: $O_2$, $N_2$, Ar, . . .
Temperature: −5 to 60° C.
Duration: 5 seconds to several minutes.

Typically, to create an island of 75 Å thickness (which will form a step of approximately 40 Å), an $O_2$ plasma can be used, at an RF power of 1300 W, for 20 seconds at a pressure of 50 mTorr and with a flow rate of 200 sccm, at ambient temperature.

Alternatively, it is likewise possible to use a fluorinated gas-based plasma ($CF_4$, Ar, $O_2$) enabling more efficient island-forming etching, ending with a pure $O_2$ plasma, in order to recover a hydrophilic surface and/or to remove the resin.

Another advantage of the plasma treatment is its effect of activating the substrates and intensifying the bonding energies of the molecular adhesion-bonded substrates.

Thus, the plasma treatment has the advantage of combining the formation of insulating islands and the activation thereof into a single step.

Another way of filling in the cavities consists in forming $SiO_2$ islands via deposition or thermal oxidation, using techniques well known to those skilled in the art. When thermal oxidation is used, the thickness of the oxide can be controlled to between approximately 20 angstroms and several thousand angstroms.

According to one alternative embodiment, thermal oxidation can be carried out in addition to formation of the islands via a plasma treatment, thermal oxidation can be carried out in order to obtain islands having a larger thickness. In a case such as this, oxidation of the first substrate 10 over the entire surface thereof is carried out first, followed by the previously described masking step, and then the oxide inside the open cavities in the mask is etched by means of the plasma treatment.

Figure 5C:
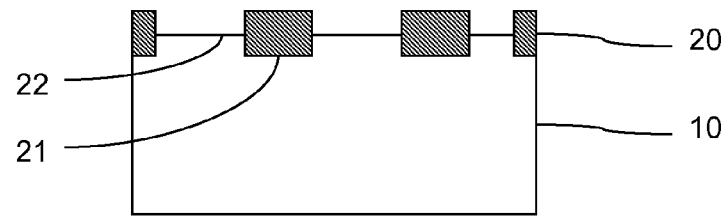

With reference to FIG. 5C, a third step consists in removing the mask 40, so as to obtain a bonding layer 20 consisting of insulating islands 21 distributed in the desired pattern. The islands 21 obtained via the plasma treatment described above are also activated thereby.

Based on the nature of the mask 40, a plasma treatment or chemical etching can be employed so as to selectively remove the mask 40.

According to an alternative embodiment, the plasma treatment can be used to remove the mask 40 at the same time as the islands 21 are formed. As a matter of fact, the light-sensitive resins are removed in a relatively conventional manner, using an oxygen plasma.

If it is not desired for the plasma treatment to remove the resin, a resin thickness will be chosen sufficient to not be entirely consumed during the plasma activation step.

On the other hand, if it is desired for the islands to be created and for the resin to be removed in one and the same treatment, then it will suffice to choose a suitable resin type and thickness to ensure that all of it is consumed during the treatment.

A bonding layer 20 is thus obtained, which consists of islands 21 separated from one another by regions 22 of a different type, preferably by a void or by the material of the first substrate 10, with the result being that the islands 21 are raised relative to the surface of the first substrate 10.

Since the use of a mask makes it possible to define patterns very precisely, the bonding surface is controlled perfectly.

Furthermore, the thickness of the islands 21 is also controlled very precisely, whereby the bonding layer 20, although discontinuous, has a uniform thickness, thereby making it possible to ensure proper bonding energy with the second substrate 30.

Furthermore, the size and distribution of the islands 21 can be chosen so as to minimize the formation of defects such as blisters.

A fourth step consists in molecular adhesion-bonding the second substrate 30 onto the first substrate 10 covered with the insulating layer 20 thereof, which consists of islands 21.

Preliminary conventional polishing and cleaning steps can be carried out.

The second substrate 30 may optionally comprise an insulating layer (e.g., $SiO_2$ or $Si_3N_4$) at the surface thereof.

Figure 6A:
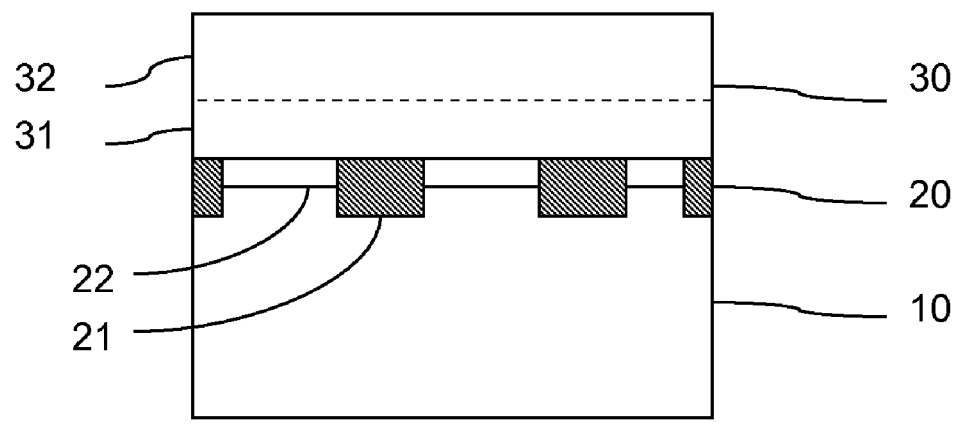
FIGS. 6A and 6B show steps for removing a self-supported layer.
Figure 7A:
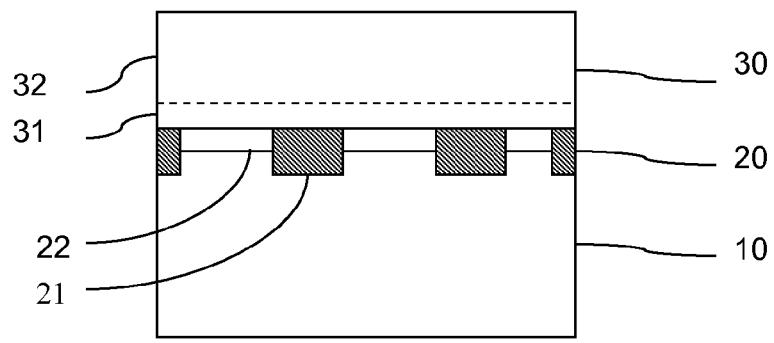
FIGS. 7A to 7D show debonding steps after bonding of a transferred layer onto a final substrate.

With reference to FIG. 6A or 7A, the second substrate 30 may likewise have been subjected to an implantation step intended to create an embrittlement area (shown by dotted lines) for the purpose of transferring a fine layer 31 to the first substrate 10.

For SeOI-type structures, such as SOI structures, for example, a heat treatment step, using conventional heat treatments, is preferably applied for the purpose of intensifying the bonding energy between the islands of the insulating layer and the second substrate.

Figure 6B:
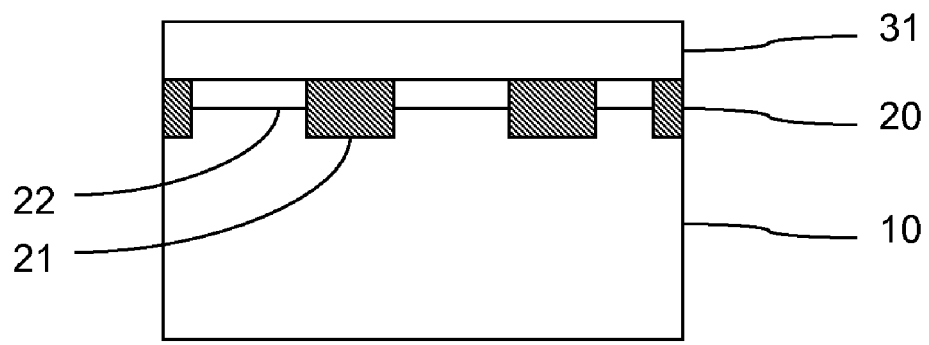
Figure 7B:
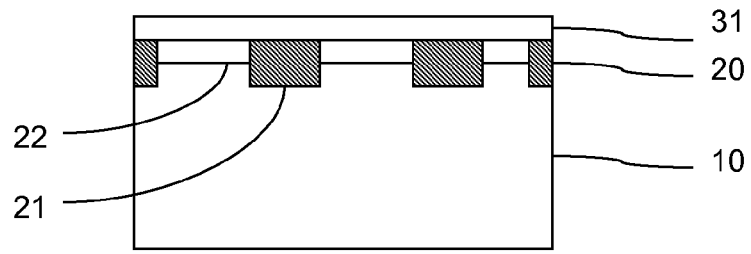

With reference to FIG. 6B or 7B, in the particular case where the second substrate 30 has undergone the aforementioned implantation step, the remainder 32 of the second substrate 30 is then detached along the embrittlement area, by means of a heat or chemical treatment or by applying mechanical forces.

Various techniques for debonding the composite substrate will now be described.

Debonding is performed either via mechanical removal or via preferential etching, such as an HF treatment, for example, this treatment being facilitated by the presence of the non-bonded areas between the islands. After debonding, a treatment of the surface of the layer 31 must be carried out, in order to polish it.

Several cases are presented according to the thickness and the fate of the layer that one wishes to detach.

With reference to FIG. 6B, if the layer 31 is sufficiently thick to be self-supported, it is removed from the bonding layer 20. A layer can typically be self-supported if the thickness thereof is greater than a few micrometers.

Figure 7C:
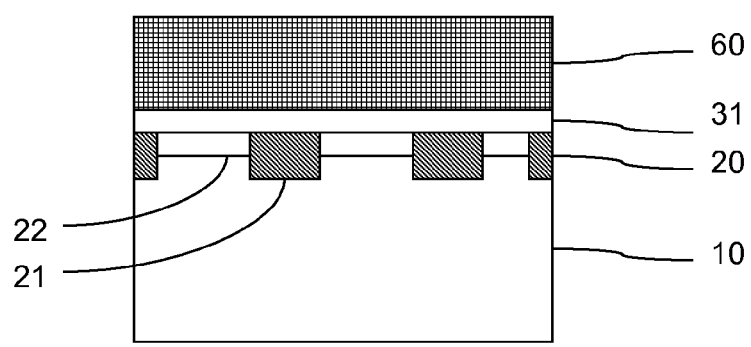
Figure 7D:
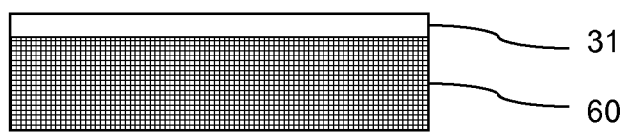

With reference to FIG. 7B, if the layer 31 is finer, it must be transferred onto a final substrate 60, which will serve as a support thereof. To that end, with reference to FIG. 7C, the final substrate 60 is bonded onto layer 31, and then, with reference to FIG. 7D, debonding is carried out with regard to the bonding layer 20.

According to another alternative embodiment, layer 31 can serve as a seed layer for epitaxial growth.

Layer 31 can likewise be bonded onto another mechanical support (plastic film, metal layer . . . ), for example, for smart card-type applications.

The invention claimed is:

1. A process for manufacturing a composite substrate comprising bonding a first substrate onto a second semiconducting substrate, the process further comprising, before bonding, the formation of a bonding layer between the first and the second substrate, the bonding layer comprising a plurality of islands distributed over a surface of the first substrate in a determined pattern and separated from one another by regions of a different type, which are distributed in a complementary pattern, wherein the islands are formed via a plasma treatment of a material of the first substrate, and wherein the plasma is of the $O_2$ or $N_2$ type, or a mixture thereof.

2. The process according to claim 1, wherein the regions of a different type are made of a different material from that of the islands.

3. The process according to claim 1, wherein the regions of a different type are empty.

4. The process according to claim 1, further comprising, after bonding, a heat treatment, which is intended to intensify the bonding energy.

5. The process according to claim 1, wherein the bonding is followed by debonding the second substrate and the first substrate.

6. The process according to claim 5, wherein the debonding is carried out via chemical etching.

7. A process for manufacturing a composite substrate comprising bonding a first substrate onto a second semiconducting substrate, the process further comprising:

formation of a bonding layer between the first and the second substrate before bonding, the bonding layer comprising a plurality of islands distributed over a surface of the first substrate in a determined pattern and separated from one another by regions of a different type, which are distributed in a complementary pattern, wherein the islands are formed via a plasma treatment of a material of the first substrate;

formation of a mask on the surface of the first substrate in the complementary pattern, whereby the mask does not cover areas of the first substrate corresponding to the pattern; and formation of the islands in the areas of the first substrate not covered by the mask.

8. The process according to claim 7, wherein a mask removal process is carried out during or after formation of the islands in the areas of the first substrate not covered by the mask.

9. A process for manufacturing a composite substrate comprising bonding a first substrate onto a second semiconducting substrate, the process further comprising:

production of an embrittlement area in the second substrate so as to define a thin layer before bonding; and formation of a bonding layer between the first and the second substrate before bonding, the bonding layer comprising a plurality of islands distributed over a surface of the first substrate in a determined pattern and separated from one another by regions of a different type, which are distributed in a complementary pattern, wherein the islands are formed via a plasma treatment of a material of the first substrate.

10. The process according to claim 9, further comprising, after bonding, a remainder of the second substrate is detached along the embrittlement area, so that the thin layer is transferred onto the first substrate.

11. A process for manufacturing a composite substrate comprising bonding a first substrate onto a second semiconducting substrate in a molecular adhesion-bonding operation, the process further comprising forming of a bonding layer between the first and the second substrate before bonding, the bonding layer comprising a plurality of islands distributed over a surface of the first substrate in a determined pattern and separated from one another by regions of a different type, which are distributed in a complementary pattern, wherein the islands are formed via a plasma treatment of a material of the first substrate.

12. A process for manufacturing a composite substrate comprising bonding a first substrate onto a second semiconducting substrate, the process further comprising:

formation of a bonding layer between the first and the second substrate before bonding, the bonding layer comprising a plurality of islands distributed over a surface of the first substrate in a determined pattern and separated from one another by regions of a different type, which are distributed in a complementary pattern, wherein the islands are formed via a plasma treatment of a material of the first substrate;

bonding a thin layer onto a final support; and debonding the second substrate from the first substrate.

* * * * *

UNITED STATES PATENT AND TRADEMARK OFFICE
CERTIFICATE OF CORRECTION

| | | |
|---|---|---|
| PATENT NO. | : 8,153,504 B2 | Page 1 of 1 |
| APPLICATION NO. | : 12/742424 | |
| DATED | : April 10, 2012 | |
| INVENTOR(S) | : Frederic Allibert et al. | |

It is certified that error appears in the above-identified patent and that said Letters Patent is hereby corrected as shown below:

In the specification:
    COLUMN 7,    LINE 31,    change "that will" to --will--

Signed and Sealed this
Twenty-fourth Day of February, 2015

Michelle K. Lee
*Deputy Director of the United States Patent and Trademark Office*